June 21, 1966 C. W. MUELLER 3,257,588

SEMICONDUCTOR DEVICE ENCLOSURES

Filed April 27, 1959 2 Sheets-Sheet 1

INVENTOR.
CHARLES W. MUELLER
BY
W.S. Hill
AGENT

INVENTOR.
CHARLES W. MUELLER
BY
W. S. Hill
AGENT

United States Patent Office 3,257,588
Patented June 21, 1966

3,257,588
SEMICONDUCTOR DEVICE ENCLOSURES
Charles W. Mueller, Princeton, N.J., assignor to Radio Corporation of America, a corporation of Delaware
Filed Apr. 27, 1959, Ser. No. 809,235
11 Claims. (Cl. 317—234)

This invention relates to the fabrication of semiconductor devices, and more particularly to improved miniaturized enclosures for semiconductor devices.

Semiconductor devices such as diodes and transistors contain at least one rectifying barrier. The barrier is the transition region or boundary between regions of different conductivity type, such as a P-conductivity type region and an N-conductivity type region in a semiconductor body or wafer. Barriers of this type, which are known an PN junctions, are adversely affected by moisture, dust, acids, and corrosive ambients. Rectifying barriers also exist at the line of demarcation between regions of different conductivity magnitude, and are similarly sensitive to moisture and the atmosphere. It is therefore standard practice to case semiconductor devices in hermetically sealed enclosures, which may be made of plastic, glass, or a ceramic, but are commonly made of metal. Metal enclosures are preferred, as they are easily sealed and will readily conduct the heat dissipated by the devices to a heat sink.

In order to attain high frequency operation, it is desirable to reduce the dimensions of semiconductor devices. Such high frequency devices by themselves are so small that they could advantageously be used for direct insertion in printed circuits and in microstrip transmission lines, but the active junctions of the unit require protection, and when the devices are heremetically sealed and cased by conventional methods the size, weight and cost of the case are so great as to be prohibitive for such applications.

Accordingly, it is an object of the present invention to provide improved semiconductor devices having improved enclosures.

Another object of the invention is to provide an inexpensive and easily sealed enclosure for semiconductor devices.

Still another object is to provide an improved enclosure for high frequency semiconductor devices.

But another object is to provide an improved semiconductor device enclosure especially adapted for use in printed circuits.

These and other objects are attained by the instant invention, which provides a semiconductor junction device having an enclosure of microminiature proportions comprising an insulating member bonded to a semiconductor wafer, so that the wafer itself forms a portion of the enclosure. The insulating member is positioned on the semiconductor body so as to surround an active rectifying barrier but spaced therefrom, thereby enclosing the barrier or junction between the insulating member and the bulk of the semiconductor wafer itself.

The invention will be described in greater detail with reference to the accompanying drawing, in which.

Similar reference characters are applied to similar elements throughout the drawing.

Figure 1:
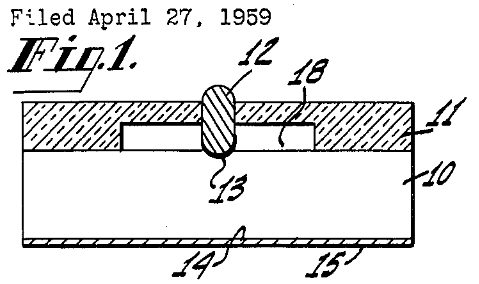
FIGURES 1–8 are cross-sectional elevational views of diode enclosures in accordance with different embodiments of the invention.

FIGURE 1 is a cross-sectional view showing the structure of a semiconductor device enclosure according to one embodiment of the invention. The particular device shown is of the single junction diode or rectifier type, and consists of a solid crystalline semiconductive body or wafer 10 of one conductivity type. The semiconductor utilized may be germanium, silicon, germanium-silicon alloys, or the like. In this example, the semiconductor body 10 consists substantially of a P-conductivity type monocrystalline germanium wafer having two opposing major faces 14 and 18.. An apertured insulating member 11 is bonded directly to one major face 18 of the semiconductor wafer 10. The insulating member 11 in this example is generally cup-shaped. The member 11 is composed of materials with a high dielectric constant such as glass, including glass frit, Pyroceram, and the like, ceramics such as forsterite, steatite, alumina, and the like, or similar insulating materials such as Ceramicon. The material is selected from those which have the desired physical characteristics for the purpose intended and the particular semiconductor utilized. Thus where high frequency operation is intended, a low loss material such as an alumina composition is desirable. In this example, the insulating member 11 is an alumina composition known as Frenchtown 4462. It is preferable that the expension of the ceramic or insulating member matches that of the semiconductor body. However, the match need not be exact since the dimensions involved are small. The methods of bonding such insulating materials to semiconductor wafers are known to the art as ceramic-metal and glass-to-metal seals, and are discussed separately below.

Next, electrical contact is made to one face of the wafer 10 and, at the same time, a rectifying junction is formed therein by forcing a drop 12 of metal or metallic alloy inwardly through the aperture of insulating member 11. The metal plug 12 thus formed also hermetically seals the aperture of insulating member 11. The plug material is electrically conductive, and is forced into the aperture while heated to a molten or plastic state, so that the plug 12 contacts surface 18 of wafer 10. In this example, the plug 12 is an alloy of 99 weight percent lead–1 weight percent antimony. Since antimony is a donor in germanium, a PN junction 13 is formed at the alloy front between plug 12 and wafer 10. Thus in this example the rectifying barrier is formed in the same operation which seals the device. The active junction 13 is thereby completely enclosed and hermetically sealed between the insulating member 11 and the bulk of semiconductor wafer 10. For further protection of the active junction 13, the step of sealing the device with plug 12 is performed in a non-oxidizing or inert ambient, such as dry nitrogen or argon. In this example, the step of sealing the insulating member 11 is performed in dry nitrogen, so that the atmosphere within the device and around the active junction 13 contains neither oxygen nor moisture.

To complete the device, a non-rectifying or ohmic contact 15 is made to another face of wafer 10, preferably to major face 14 opposite insulating member 11. The ohmic contact may be made by alloying to wafer face 14 an electrode pellet of material which is either electrically neutral (that is, does not effect the conductivity type of the semiconductor), or is of the same conductivity type as the wafer 10. Alternatively, a non-rectifying contact is formed by depositing a metal film on wafer face 14, the metal being selected from those which either do not affect the conductivity type of the semiconductor, or are of the same conductivity type as the wafer. In this example, ohmic contact 15 is a coating of rhodium deposited on wafer face 14.

The enclosed and hermetically sealed unit thus formed is generally button shaped. Such miniature diodes according to the invention have been made in the form of discs with a diameter of the order of 50 mils. The completed units are readily applied to a printed circuit or a a microstrip transmission line. It will be appreciated by those skilled in the art that the conductivity types recited above are illustrative, and may be readily reversed, for example, by using an N-conductivity type wafer and an acceptor material as the plug.

The bonding of the insulating member 11 to the semiconductor wafer 10 is accomplished by any of the methods used in making glass-to-metal and ceramic-metal seals. These processes involve metallizing the desired surface of the glass or ceramic body, for example by sintering powdered metals such as molybdenum and tungsten over the surface of the body. Alternatively, powdered molybdates or tungstates may be suspended in a binder and applied to the desired surface of the glass or ceramic member. The glass or ceramic article is then fired in a reducing ambient, so that the tungstate or molybdate compound is reduced to a film of the corresponding metal. In another embodiment, powdered oxides of molybdenum or tungsten, or mixtures of the two oxides, are suspended in an organic binder. The suspension is similarly applied to the surface of the ceramic or glass article, and fired in a reducing atmosphere such as hydrogen to form a metal film over the surface of the article. The adherent metal film thus produced is readily brazed to the surface of the semiconductor body, using for example brazes of the Au-Ni type. Other methods of making glass-to-metal or ceramic-metal seals are known to the art, and any convenient process may be utilized.

Figure 2:
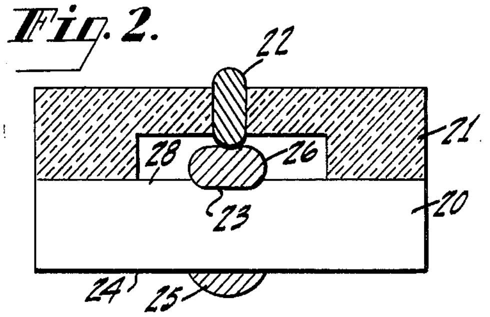

Another embodiment of the invention is shown in FIGURE 2. In this example, semiconductor wafer 20 is composed of an N-conductivity type alloy of 99 atomic percent germanium–1 atomic percent silicon. A rectifying electrode pellet 26 is alloyed to one major face 28 of wafer 20. The electrode pellet 26 must contain an acceptor to be rectifying to the N-type wafer 20. In this example, pellet 26 is an alloy of 98 weight percent indium–2 weight percent aluminum. A PN junction 23 is formed at the interface or alloy front between electrode 26 and wafer 20.

Next, an apertured insulating member 21, which in this example consists of forsterite, is bonded to major wafer face 28 around electrode 26, so that the aperture is directly over the electrode. The aperture is then sealed in an inert atmosphere by means of conductive plug 22 which contacts rectifying electrode 26. The plug may consist of an inert fusible material such as lead, tin, or the like. In this example, plug 22 is an alloy of 99.5 weight percent lead–0.5 weight percent indium, so as to insure good contact to electrode 26.

To complete the device, an ohmic contact may be made to the wafer 20 in a manner similar to that utilized for the device of FIGURE 1. In this embodiment, an alternative method of fabricating the non-rectifying connection is selected, in which an electrode pellet 25 is fused to wafer face 24 opposite insulating member 21. The pellet 25 consists for example of pure tin, which is electrically neutral with respect to germanium and silicon. Since wafer 20 is of N-conductivity type, a donor-containing material may be utilized instead to form the ohmic contact 25. In each embodiment it is preferable that the diameter of the conductive plug be small, for ease in sealing the device and avoiding thermal expansion mismatch.

An advantage of this embodiment is that the rectifying electrode 26 and hence the barrier area 23 may be made larger than the corresponding barrier 13 of the device in FIGURE 1, thereby increasing the power-handling capability of the unit.

Figure 3:
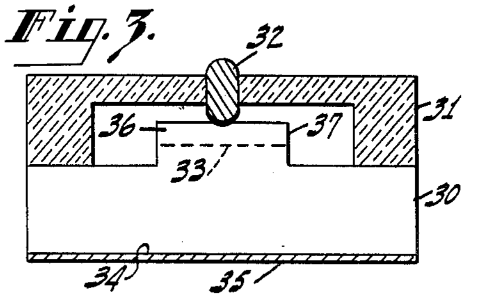

Another embodiment of the invention is illustrated in FIGURE 3. In this example, the semiconductor body consists of a given conductivity type wafer 30 bearing a mesa or boss 37 on one major wafer face. The upper portion 36 of boss 37 is converted to opposite conductivity type so that a PN junction 33 is formed in boss 37 at the interface between region 36 and the bulk of wafer 30. In this example, the wafer 30 consists of P-conductivity type germanium, and the surface region of boss 37 is converted to N-conductivity type by the diffusion of arsenic therein.

The device is enclosed by bonding an apertured insulating member 31 to the one major wafer face around plateau or boss 37. In this example, insulating member 31 is composed of alumina. Next, the device is sealed, in a dry nitrogen atmosphere by means of a plug or drop 32 of fusible material, such as lead or tin. In this example, plug 32 is a lead-tin solder. Alternatively, a donor-containing material such as 99 weight percent lead–1 weight percent arsenic may be utilized instead of the electrically neutral or inert solder, since the plug serves the double purpose of sealing the device and making a good ohmic contact to the N-type surface region 36. The active junction 33 is thus enclosed between the insulating member 31 and the bulk of wafer 30.

To complete the device, an ohmic contact 35 is made to the major wafer face 34 opposite boss 37. The contact 35 is a coating or film of a metal such as rhodium, palladium, or the like, which is electrically inert with respect to the semiconductor. In this example, the ohmic contact 35 is a film of platinum. An advantage of this embodiment is that rectifying barrier 33, which is fabricated by diffusion techniques, is readily made larger than junctions made by the surface alloy process.

Figure 4:
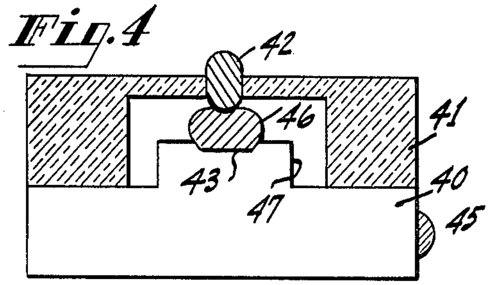

Still another embodiment of the invention is represented in FIGURE 4, wherein semiconductor body 40 is a wafer of P-conductive type gallium arsenide bearing a boss 47 on one major wafer face. A rectifying electrode pellet 46 is alloyed to the upper surface of boss 47. In this example, pellet 46 consists of tin telluride. Since tellurium is a donor in III–V compounds, a PN junction 43 is formed at the alloy front between electrode pellet 46 and the P-type bulk of the wafer.

An apertured insulating member 41 composed of Pyroceram is then bonded to wafer 40 around boss 47, so that the aperture is coaxial with electrode 46. The aperture is then sealed in a dry inert atmosphere by means of conductive plug 42, which simultaneously forms a good electrical contact to electrode 46. In this example, plug 42 consists of tin. If desired, alloys of tin with tellurium may be used for plug 42.

The device is completed by forming an ohmic contact 45 to any face of wafer 40 other than that protected by the insulating cover 41. In this example, the ohmic contact is prepared by alloying to a minor face of wafer 40 an electrode pellet 45 consisting of gallium. Such III–V compound diodes are particularly suitable for high temperature and high frequency operation. The advantages of gallium arsenide diodes are described in detail by D. A. Jenny on pages 717–722, Proceedings of the IRE, April 1958.

Figure 5:
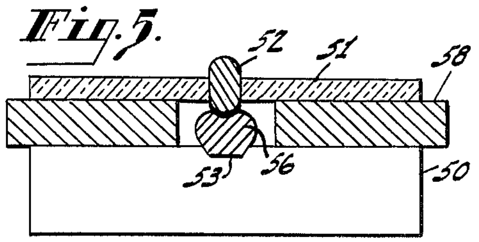

In the embodiments described above, the two diode contacts are on different faces of the semiconductor wafer. It is desirable in some applications to have both contacts on the same side of the wafer. This arrangement is readily achieved according to the instant invention by a modification of the enclosure described in connection with FIGURE 2. Such modification is illustrated in FIGURE 5, which shows rectifying electrode pellet 56 alloyed to one major face of semiconductor wafer 50 so as to form PN junction 53 at the alloy front. Metal washer or collar 58 is then bonded to the same wafer face around the electrode 56. Washer 58 preferably projects over the periphery of wafer 50, and is made of a metal or alloy which is electrically inert with respect to the particular semiconductor. Suitable materials for this purpose are Kovar, rhodium, palladium, tantalum, molybdenum, and the like. In the device of FIGURE 5, the semiconductor body 50 is a P-conductivity type wafer of 95 atomic percent germanium–5 atomic percent silicon, while electrode pellet 56 consists of 99 weight percent lead–1 weight percent arsenic.

The metal washer 58 may be bonded to wafer 50 by any convenient technique, for example by soldering with lead or lead-tin alloys. A small amount of an acceptor such as indium may be added to the solder to insure a good contact with the P-type wafer. Another method of bonding washer 58 to wafer 50 will now be described. In this example, collar 58 consists of a titanium washer which is brazed to wafer 50 by means of a gold-nickel braze. To insure a good seal, a coating of electroless nickel is previously deposited on the periphery of the wafer face around electrode pellet 56.

Next, an apertured insulating disc 51 is bonded to the upper face of washer 58 so that the aperture is coaxial to electrode 56. In this example, disc 51 is a high-alumina ceramic which is metallized with molybdenum by one of the methods described in connection with FIGURE 1. A mixture of copper and titanium powder is spread on the upper surface of washer 58, and the assembly of wafer 50, washer 58, and disc 51 is heated in an inert atmosphere so as to form a hermetic bond betwen disc and washer.

The device is completed by means of a fusible plug 52 which seals the aperture of ceramic disc 51 and forms an ohmic contact to rectifying electrode 56. In this example, plug 52 consists of lead. It will be seen that in this modification one contact of the unit is plug 52, while the other contact is the exposed periphery of metal washer 58, and both contacts are on the same side of the device.

Figure 6:
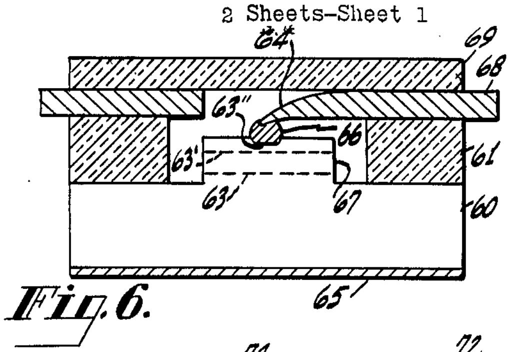

Another embodiment of the invention is illustrated in FIGURE 6 as applied to the PNPN diode. The characteristics of this tri-junction device are described in an article by Dr. W. Shockley, "Unique Properties of the Four-Layer Diode," Electronic Industries, August 1957. An N-conductivity type silicon wafer 60 is prepared with a central boss 67 on one major wafer face. An acceptor such as indium is diffused into the upper surface of boss 67 so as to convert the upper layer of the boss to P-conductivity type, thereby forming a PN junction 63 between the converted layer and the bulk of wafer 41. Next, a donor such as arsenic is diffused into the upper surface of the boss for a shorter distance than the acceptor, so that another PN junction 63′ is formed between the arsenic-diffused region and the remainder of the indium-diffused region. An electrode pellet 66, which consists of acceptor material, is then fused to the upper surface of boss 67. In this example, the pellet 66 consists of 99.5 weight percent indium–.5 weight percent gallium. A third PN junction 63″ is formed at the alloy front between the acceptor pellet 66 and the arsenic-diffused surface layer of boss 67.

To enclose the device, an insulating member 61 is bonded to the one major wafer face around boss 67. In this example, the insulating member 61 is a steatite washer. An apertured metal disc 68 bearing a finger or lobe 64 on its inner periphery is positioned on the upper surface of steatite collar 61, so that lobe 64 is in contact with rectifying electrode 66. The disc 68 is then bonded to the insulating washer 61. Disc 68 is made of an electrically conductive metal or alloy such as nickel, Kovar, and the like, and preferably has a diameter somewhat greater than the diameter of washer 61. In this example, disc 68 consists of Kovar.

Next, the device is sealed by bonding a solid insulating plate 69 to the upper surface of metal disc 68. The plate 69 may be glass or ceramic, and is preferably of the same diameter as the washer 61, so that the outer periphery of metal disc 68 is available as an electrical contact. In this example, plate 69 is steatite. The device is completed by making an electrical connection to the N-type bulk of wafer 60. Such a non-rectifying connection is conveniently fabricated by depositing a conductive metal layer 65 on the major wafer face opposite boss 67. The metal should be selected from those, such as rhodium and tin, which do not affect the conductivity type of semiconductor wafer 60. In this example, the metal layer 65 is rhodium. It will be seen that in this embodiment the P-type contact of the device is made by plate 68, while the N-type contact is made by rhodium layer 65. It will be understood that similar devices may be made from P-type semiconductive wafers, so that the polarities of the various device layers and contacts are reversed.

Figure 7:
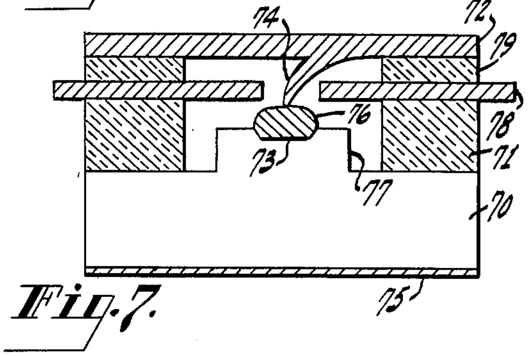

For high-frequency applications, it is desirable to reduce the total capacitance of the junction device. The capacitance of the unit as "seen" by the circuit is approximately the sum of the device capacitance and the inter-electrode capacitance. The latter can be reduced by the modification shown in FIGURE 7. In this embodiment, which is similar to the device of FIGURE 4, a rectifying electrode pellet 76 is alloyed to boss 77 on one major face of semiconductor wafer 70, thereby forming PN barrier 73 within the boss. A ceramic insulating washer 71 is bonded to the one major wafer face around boss 77. Next, a metal ring or washer 78 is coaxially bonded to the upper surface of ceramic washer 71. A second insulating washer 79, preferably of the same material and diameter as the first insulating washer 71, is coaxially bonded to the upper surface of metal ring 78. The device is enclosed by bonding a solid metal plate 72 to the upper surface of ceramic washer 79. Plate 72 bears on its lower face a lobe or projection 74 which forms an electrical contact to rectifying pellet 76.

The device is completed by forming an ohmic contact to wafer 70. In this example, the ohmic contact is a metal coating 75 deposited on the major wafer face opposite boss 77. Metal plate 72 and metal layer 75 thus constitute the two contacts of the unit, and the capacitance between these contacts is reduced by metal washer 78, which serves as a shield. If desired, shield 78 may be grounded.

Figure 8:
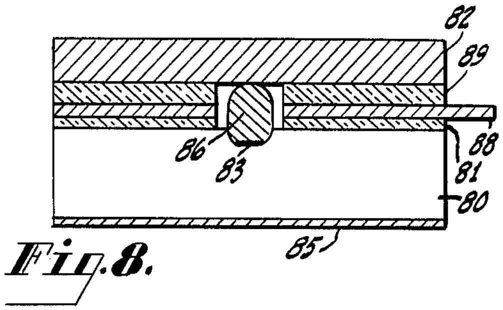

Device capacitance may also be reduced by the structure shown in FIGURE 8. In this embodiment, rectifying electrode pellet 86 is alloyed to one major face of semiconductor wafer 80, forming PN junction 83 at the alloy front between pellet and wafer. A first insulating washer 81 is bonded to said one major wafer face around electrode 86. Metal collar 88 is bonded to the upper surface of washer 81 coaxially around electrode 86. Preferably metal collar 88 extends over the periphery of washer 81. A second insulating washer 89 is coaxially bonded to the upper surface of metal collar 88. The PN junction 83 is enclosed by bonding a metal plate 82 to the upper surface of washer 89, which is composed of one of the ceramics previously mentioned. Plate 82 is in ohmic electrical contact with pellet 86. A second device contact is made by depositing a metal coating 85 on the major wafer face opposite electrode 86. Collar 88 thus serves as a shield between plate 82 and coating 85.

Figure 9:
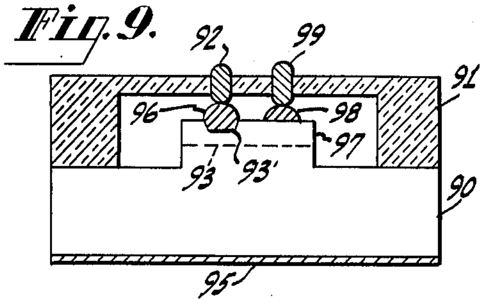
FIGURES 9–15 are cross-sectional elevational views of transistor enclosures in accordance with other embodiments of the invention; and, FIGURE 16 is a partly sectional fragmentary view of a diode enclosed in accordance with the instant invention and inserted in a microstrip transmission line.

The invention is not limited to diodes, and may be applied to devices such as transistors which have a plurality of rectifying barriers. An enclosure according to the invention for a transistor of the triode type is illustrated in FIGURE 9. A semiconductor wafer 90, which in this example is N-type germanium, is prepared with a boss or plateau 97 on one major face. The upper layer of boss 97 is converted to P-conductivity type by diffusing an acceptor therein. PN junction 93 is thereby formed between the bulk of the wafer 90, and the acceptor-diffused region, which subsequently becomes the base region of the device.

The emitter and base electrodes are formed next. A donor-containing electrode pellet 96 is alloyed to the upper surface of boss 97, so that a second PN junction 93′ is formed at the alloy front between the donor-containing electrode 96 and the acceptor-diffused portion of boss 97. In this example, the rectifying electrode pellet 96 consists of 99 weight percent lead–1 weight percent arsenic. A second electrode pellet 98 is fused to another portion of the boss 97 upper surface, but pellet 98 is of material which does not alter the conductivity type of the semiconductor. The connection between pellet 98 and the upper face of boss 97 is therefore ohmic or non-rectifying in character. In this example, electrode pellet 98 consists essentially of lead, with ½ weight percent indium added to insure a good ohmic contact to the acceptor diffused region.

Next, a doubly-apertured cup-shaped insulating member 91 is bonded to the one major wafer face around boss 97. The insulating member 91 is a ceramic in this example, specifically Frenchtown 4462, and is positioned so that one aperture is located directly above rectifying electrode 96, while the other aperture is directly over ohmic electrode 98. The unit is then hermetically sealed in a dry inert ambient (argon) by means of conductive plugs 92 and 99, which seal the apertures of members 91 and simultaneously form electrical contacts to pellets 96 and 98 respectively. Plugs 92 and 99 are suitably made of lead or solder.

The device is completed by making a collector contact. In this example, a layer or coating 95 of an inert conductive metal such as rhodium is applied to the major wafer face 94 opposite boss 97. It will be seen that plug 92 is the emitter contact, plug 99 is the base contact, and metal coating 95 is the collector contact of the finished NPN unit.

Figures 10, 11, 12, 13, 14, 15:
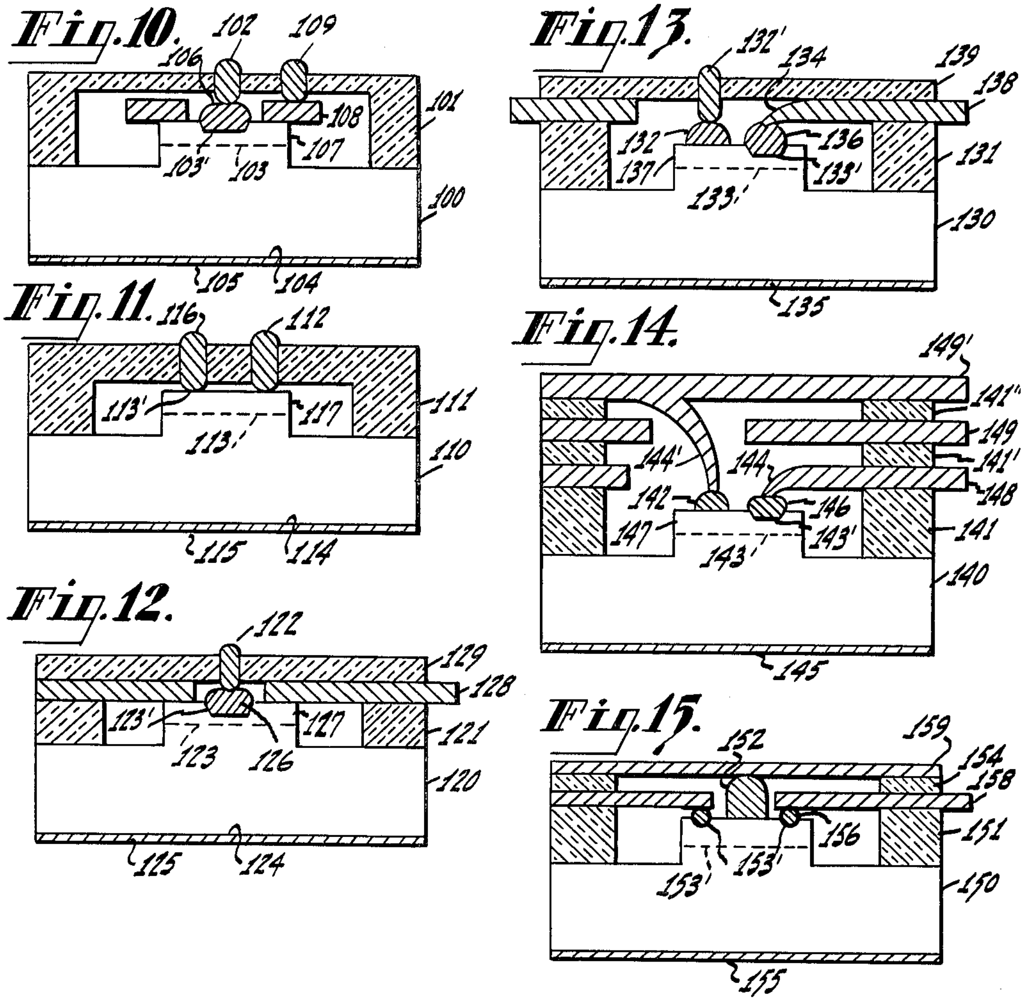

Another transistor enclosure according to the invention is fabricated as in FIGURE 10 from semiconductor wafer 100 which is of P-conductivity type in this example, and bears boss 107 on one major wafer face. A donor is diffused into the upper portion of boss 107, converting a portion thereof to N-conductivity type and forming PN junction 103 between said converted portion and the P-type bulk of water 100. An acceptor-containing electrode pellet 106 is then alloyed to the upper face of boss 107, forming a second PN junction 103′ at the alloy front between pellet 106 and the upper portion of boss 107.

The enclosure proper is begun by bonding a washer such as an apertured metal disc 108 to the upper surface of boss 107, so that electrode pellet 106 is within the aperture. The washer 108 serves as a base connection, and is made of conductive metals or alloys such as tin and Kovar, which do not alter the conductivity type of the semiconductor body 100. In this example, disc 108 is made of Kovar. Next, a doubly-apertured cup-shaped ceramic member 101 is bonded to the one major face around boss 107. The ceramic member 101 is positioned so that one aperture is located directly above electrode 106, while the other aperture is over a portion of metal disc 108. The device is then hermetically sealed in a dry non-oxidizing atmosphere by closing the two apertures with conductive plugs 102 and 109. In this example plug 102, which makes an electrical connection to rectifying electrode 106, is suitably made of lead. Plug 109, which makes an electrical connection to metal washer 108, consists of tin. To complete the device, a layer or coating 105 of an inert conductive metal such as palladium is applied to the major wafer face 104 opposite boss 107. In the completed unit the emitter contact is plug 102, the base contact is plug 109, and the collector contact is coating 105.

FIGURE 11 illustrates a compact modification of the enclosure described in connection with FIGURE 9. In this modification a given conductivity type semiconductor wafer 110 is prepared with a mesa or boss 117 on one major wafer face. The upper layer of boss 117 is converted to the opposite conductivity type by vapor-solid diffusion techniques known to the art. PN junction 113 is thus formed between the converted region and the bulk of wafer 110.

In the next fabrication step, rectifying barrier 113 is enclosed by bonding a cup-shaped doubly-apertured insulating member 111 to the one major wafer face around mesa 117, so that the apertures are positioned over the top of the mesa. One aperture is hermetically sealed by means of a conductive plug 116, which is in contact with the converted region of boss 117. Plug 116 contains type-determining material which induces conductivity of said given conductivity type, and hence rectifying barrier 113′ is formed between plug 116 and the upper portion of boss 117, which was previously converted to opposite conductivity type. The other aperture is hermetically sealed by a conductive plug 112, which also forms a contact to the upper surface of boss 117. However, plug 112 is made of electrically inert conductive material, so that the connection between plug 112 and the upper face of boss 117 is ohmic or non-rectifying in character. If desired, the plug 112 may contain a minute amount of the same type-determining material used to convert the upper portion of the boss to opposite conductivity type. A good ohmic contact is thus insured. The sealing steps are preferably accomplished in an inert ambient. The unit is then completed by depositing an inert metal coating 115 on major wafer face 114 opposite boss 117. In this version plug 116 is the emitter contact, plug 112 is the base contact, and coating 115 is the collector contact.

Another embodiment of a transistor enclosure according to the invention is shown in FIGURE 12. The monocrystalline given conductivity type semiconductive wafer 120 is prepared as in the previous examples with a boss 127 on one major wafer face. The upper portion of boss 127 is converted to opposite conductivity type, thereby forming PN junction 123 in the boss. An electrode pellet 126 of given conductivity type material is fused to the upper surface of boss 127 so as to form another PN junction 123′ at the alloy front of electrode 126. A ceramic collar or washer 121 is bonded to the one major wafer face around boss 127. An apertured metal disc or washer 128 is positioned on the upper surface of boss 127 and ceramic collar 121 so as to surround electrode 126. Preferably the diameter of disc 128 is somewhat greater than that of collar 121. Disc 128 is then bonded to boss 127 and collar 121. Next, an apertured ceramic plate 129 is bonded to the upper surface of disc 128, so that the plate aperture is coaxially aligned with electrode 126. The device is sealed in a dry non-oxidizing atmosphere by means of conductive plug 122, which seals the aperture of ceramic plate 129 and makes an electrical connection to rectifying electrode 126. A conductive metal coating 125 on the major wafer face 124 opposite boss 127 completes the device. In this embodiment, plug 122 is the emitter contact, coating 125 is the collector contact, while disc 128 is the base contact of the device.

An alternative form of transistor enclosures according to the invention is depicted in FIGURE 13. In this modification, the given conductivity type semiconductive wafer 130 bears boss 137 on one major wafer face, and is generally similar to the semiconductive wafer of the previous example. The upper portion of boss 137 is converted to opposite conductivity type, forming PN junction 133 within the boss. Rectifying electrode 136 is a pellet of given conductivity type material which is alloyed to the upper surface of boss 137, so that a second PN junction 133′ is formed between electrode pellet 136 and boss 137. Another electrode pellet 132 is fused to the upper surface of boss 137, but pellet 132 is of material which either does not affect the conductivity type of the semiconductor, or is of conductivity type opposite the wafer, so that the connection between pellet 132 and the converted region of boss 137 is ohmic or nonrectifying in character. Ceramic collar 131 is bonded to the one major wafer face around plateau 137. A metal annulus 138 bearing a projecting portion or finger 134 on its inner periphery is positioned on the upper surface of ceramic washer 131, so that finger 134 is in contact with rectifying electrode 136. The annulus 138 is then bonded to the insulating washer 131. Next, an apertured ceramic plate 139 is bonded to the upper surface of metal ring 138, so that the plate aperture is coaxially aligned with pellet 132. The aperture of insulating plate 139 is filled by conductive plug 132′, thus sealing the device and forming an electrical connection to ohmic electrode pellet 132. A conductive metal coating 135 which is inert with respect to the semiconductor is applied to the major wafer face opposite boss 137. In this modification, metal annulus 138 is the emitter contact, plug 132' is the base contact, and coating 135 is the collector contact.

For high frequency applications where the capacitance of a transistor and its enclosure must be reduced to a minimum, a unit enclosure made in accordance with the invention may be provided with a shield which reduces the interelectrode capacitance of the device. FIGURE 14 shows such an embodiment, in which semiconductor wafer 140, boss 147, barrier or PN junction 143, rectifying electrode pellet 146, PN junction 143', ohmic electrode pellet 142, insulating collar 141, and metal annulus 148 bearing finger 144 in contact with electrode 146 are generally similar to the corresponding portions of the device described in connection with FIGURE 13. An insulating washer 141', which is preferably of the same material and diameter as washer 141, is coaxially bonded to the upper surface of annulus 148. Next, a metal ring 149 is bonded to the upper surface of washer 141'. A second insulating washer 141'' is coaxially bonded to the upper surface of ring 149. Last, the device is sealed by bonding metal plate 149' to the upper surface of washer 141''. Plate 149' bears a projection or finger 144' which contacts the ohmic electrode pellet 142. This embodiment provides shielding between the base and emitter leads.

Another version of a shielded transistor enclosure according to the inevntion is illustrated in FIGURE 15. In this embodiement, given conductivity type semiconductor wafer 150 is prepared with boss 157 on one major wafer face, and the upper portion of the boss is converted to opposite conductivity type, forming rectifying barrier 153 in the boss. An electrode pellet 152 is alloyed to the upper face of boss 157. Pellet 152 is made either of material which is inert with respect to the semiconductor, or of material which induces conductivity type opposite to that of the unconverted lower portion of the wafer. In either case, pellet 152 forms an ohmic contact to the upper surface of boss 157. A ring 156 is alloyed to the upper surface of boss 157 around electrode pellet 152. Ring 156 contains material which induces given conductivity type, and hence forms a rectifying barrier 153' with the converted portion of the boss. Insulating collar 151 is bonded to the one major wafer face around boss 157. A metal annulus 158 is positioned around electrode pellet 152, and then bonded to the upper surface of ring 158. An insulating washer 154 is bonded to the upper surface of annulus 158. The device is then sealed in an inert atmosphere by bonding metal plate 159 to the upper surface of washer 154, so that plate 159 is in direct electrical contact with electrode 152. A collector contact is made as in the previous embodiment by means of a metal coating 155 on the wafer face opposite boss 157. In this unit, plate 159 is the base contact, while annulus 158 is the emitter contact. This modification is particularly suitable for grounded emitter operation where the annulus 158 separates the collector and base circuits.

Figure 16:
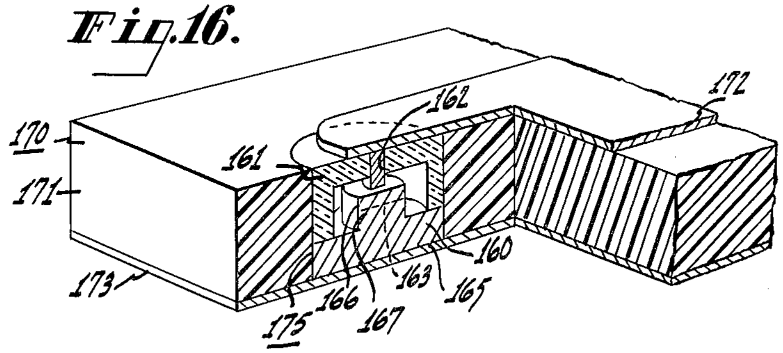

FIGURE 16 shows a junction device 175 enclosed in accordance with the instant invention and inserted into a microstrip transmission line 170. The device 175 is a diode generally similar to that described above in connection with FIGURE 3, and consists of a semiconductor wafer 160 of given conductivity type bearing a boss 167 on one major face. The upper portion 166 of the boss is converted to opposite conductivity type, forming a rectifying barrier 163 in boss 167. An apertured insulating member 161 is bonded to the one major wafer face around the boss. The aperture is sealed by a conductive plug 162 which forms an ohmic contact to converted region 166 of boss 167. Metal coating 165 is deposited on the major wafer face opposite insulating member 161.

The microstrip transmission line 170 consists of a layer 171 of a phenolic resin such as Bakelite sandwiched between two conductive metal layers 172 and 173, which usually consist of copper. A portion of one such layer 172 is removed by suitable masking and etching techniques. The thickness of the insulating member 161 of the device enclosure is adjusted to provide a proper impedance match when the device is inserted into the microstrip line. This thickness is a function of the operating frequency and the dielectric properties of the ceramic. In this embodiment, conductive coating 165 of the diode rests on copper layer 173, while conductive plug 162 of the enclosed diode is in contact with the other copper layer 172. The enclosed device 175 fits into a cavity prepared in microstrip transmission line 170. It is desirable that the device case give rise to as little disturbance of the mirostrip transmission line as possible. In the ideal case, where the encapsulation is perfectly matched to the line, the case capacitance will be absorbed into the line (thereby increasing its length) and will not represent an additional independent energy storage to be charged. This ideal cannot quite be achieved, due to the capacitance of the necessary metallic contacts.

It will be apparent to those skilled in the art that other modifications and alternate embodiments of semiconductor device enclosures may be made without departing from the spirit and scope of the instant invention.

There have thus been described improved miniaturized semiconductor device enclosures which are particularly suitable for use with printed circuits and microstrip transmission lines.

What is claimed is:

1. A semiconductor device comprising a semiconductor wafer bearing a boss on one major face, a rectifying electrode pellet alloyed to the upper surface of said boss, an insulating collar bonded to said one major face around said boss, a metal ring bonded to the upper surface of said collar, an insulating washer coaxially bonded to the upper surface of said ring, and a metal disc coaxially bonded to the upper surface of said washer, said disc bearing an extension which contacts said electrode, said disc and said wafer itself forming an enclosure around said electrode.

2. A diode comprising a semiconductor wafer bearing a boss on one major face, a rectifying electrode pellet alloyed to the upper surface of said boss, a ceramic collar bonded to said one major face around said boss, a metal ring bonded to the upper surface of said collar, a ceramic washer coaxially bonded to the upper surface of said ring, a metal disc coaxially bonded to the upper surface of said washer, said disc bearing an extension which contacts said electrode, said electrode being enclosed between said disc and said wafer itself, and an ohmic contact to the opposite major wafer face.

3. A junction device comprising a semiconductor wafer, a rectifying electrode pellet alloyed to one major wafer face, a first insulating washer bonded to said one wafer face around said electrode, a metal ring coaxially bonded to the upper surface of said first washer around said electrode, a second insulating washer bonded to the upper surface of said ring coaxially to said electrode, and a metal plate bonded to the upper surface of said washer, said plate being in electrical contact with said electrode, said electrode being enclosed between said plate and said wafer itself.

4. A diode comprising a rectifying electrode pellet alloyed to one major face of a semiconductor wafer, a first ceramic washer bonded to said one wafer face around said electrode, a metal ring coaxially bonded to the upper surface of said first washer around said electrode, a second ceramic washer bonded to the upper surface of said ring coaxially to said electrode, a metal plate bonded to the upper surface of said second washer, said plate being in electrical contact with said electrode and forming with said wafer itself an enclosure around said electrode, and an ohmic contact to the opposite major wafer face.

5. A transistor comprising a given conductivity type semiconductor wafer bearing a boss on one major face, a region of opposite conductivity type on the upper surface of said boss, a PN junction between said region and the bulk of said wafer, a rectifying electrode pellet alloyed to one portion of said upper surface of said boss, an insulating collar bonded to said one major face around said boss, a metal ring bonded to the upper surface of said boss and said collar, an apertured insulating plate coaxially bonded to the upper surface of said ring, and a conductive plug sealing said aperture, said plug being in contact with said rectifying electrode, said plate and said wafer itself forming an enclosure around said electrode.

6. A transistor comprising a given conductivity type semiconductor wafer bearing a boss on one major face, a region of opposite conductivity type on the upper surface of said boss, a PN junction between said region and the bulk of said wafer, a recifying electrode pellet alloyed to one portion of said upper surface of said boss, a ceramic collar bonded to said one major face around said boss, a metal ring bonded to the upper surface of said boss and said collar, an apertured ceramic plate coaxially bonded to the upper surface of said ring, an electrically conductive plug sealing said aperture, said plug being in contact with said rectifying electrode, said electrode being enclosed between said plate and said wafer itself, and an ohmic contact to the opposite major wafer face.

7. A transistor comprising a given conductivity type semiconductor wafer bearing a boss on one major face, a region of opposite conductivity type on the upper surface of said boss, a PN junction between said region and the bulk of said wafer, a rectifying electrode pellet alloyed to one portion of said upper surface of said boss, an ohmic electrode pellet alloyed to another portion of said upper surface of said boss, an insulating collar bonded to said one major face around said boss, a metal ring bonded to the upper surface of said collar, said ring bearing an inner projection which contacts said rectifying electrode, an apertured insulating plate bonded to the upper surface of said ring, and a conductive plug hermetically sealing said aperture, said plug being in contact with said ohmic electrode, said electrodes being enclosed between said plate and said wafer itself.

8. A transistor comprising a given conductivity type semiconductor wafer bearing a boss on one major face, a region of opposite conductivity type on the upper surface of said boss, a PN junction between said region and the bulk of said wafer, a rectifying electrode pellet alloyed to one portion of said upper surface of said boss, an ohmic electrode pellet alloyed to another portion of said upper surface of said boss, a ceramic washer bonded to said one major face around said boss, a metal ring bonded to the upper surface of said washer, said ring bearing an inner projection which contacts said rectifying electrode, an apertured ceramic disc bonded to the upper surface of said ring, an electrically conductive plug hermetically sealing said aperture, said plug being in contact with said ohmic electrode, said disc and said wafer itself forming an enclosure around said electrodes, and an ohmic contact to the opposite major wafer face.

9. A transistor comprising a given conductivity type semiconductor wafer bearing a boss on one major face, a region of opposite conductivity type on the upper surface of said boss, a PN junction between said region and the bulk of said wafer, a rectifying electrode pellet alloyed to one portion of said upper surface of said boss, an ohmic electrode pellet alloyed to another portion of said upper surface of said boss, a first insulating collar bonded to said one major face around said boss, a metal ring bonded to the upper surface of said collar, said ring bearing an inner projection which contacts said rectifying electrode, a first insulating washer bonded to the upper surface of said ring, a metal washer bonded to the upper surface of said insulating washer, a second insulating washer bonded to the upper surface of said metal washer, and a metal plate bonded to the upper surface of said insulating washer, said plate bearing a projection which contacts said ohmic electrode, said plate and said wafer itself forming an enclosure around said electrodes.

10. A transistor comprising a given conductivity type semiconductor wafer bearing a boss on one major face, a region of opposite conductivity type on the upper surface of said boss, a PN junction between said region and the bulk of said wafer, a rectifying electrode pellet alloyed to one portion of said upper surface of said boss, an ohmic electrode pellet alloyed to another portion of said upper surface of said boss, an insulating collar alloyed to one wafer face around said boss, a metal annulus bonded to the upper surface of said rectifying electrode and the upper surface of said collar, said annulus being coaxial to said ohmic electrode, an insulating washer bonded to the upper surface of said annulus, and a metal plate bonded to the upper surface of said washer, said plate being in electrical contact with said ohmic electrode, said plate and said wafer itself forming an enclosure around said electrodes.

11. A transistor enclosure comprising a given conductivity type semiconductor wafer bearing a boss on one major face, a region of opposite conductivity type on the upper surface of said boss, a PN junction between said region and the bulk of said wafer, an ohmic electrode pellet alloyed to one portion of said upper surface of said boss, a ring-shaped rectifying electrode pellet alloyed to said upper surface of said boss around said ohmic electrode, a ceramic collar alloyed to one wafer face around said boss, a metal annulus bonded to the upper surface of said rectifying electrode and the upper surface of said collar, said annulus being coaxial to said ohmic electrode, a ceramic washer bonded to the upper surface of said annulus, a metal plate bonded to the upper surface of said washer, said plate being in electrical contact with said ohmic electrode, said electrodes being enclosed between said plate and said wafer itself, and an ohmic contact to the opposite major wafer face.

References Cited by the Examiner

UNITED STATES PATENTS

| | | | |
|---|---|---|---|
| 2,569,347 | 9/1951 | Shockley | 317—235 |
| 2,759,133 | 8/1956 | Mueller | 317—235 |
| 2,781,480 | 2/1957 | Mueller | 317—234 |
| 2,804,581 | 8/1957 | Lichtgarn | 317—235 |
| 2,840,885 | 7/1958 | Cressell | 29—25.3 |
| 2,894,183 | 7/1959 | Fermanian | 317—235 |
| 2,906,932 | 9/1959 | Fedotowsky | 317—240 |

JOHN W. HUCKERT, *Primary Examiner.*

LLOYD McCOLLUM, GEORGE N. WESTBY, *Examiners.*

A. B. GOODALL, A. S. KATZ, *Assistant Examiners.*